(12) United States Patent
Tchoul

(10) Patent No.: US 12,256,629 B2
(45) Date of Patent: Mar. 18, 2025

(54) CURABLE SELF-ADHESIVE WAVELENGTH CONVERTING FILM AND LIGHT EMITTING DEVICE COMPRISING THE SAME

(71) Applicant: OSRAM Opto Semiconductors GmbH, Regensburg (DE)

(72) Inventor: Maxim Tchoul, Winchester, MA (US)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 478 days.

(21) Appl. No.: 17/531,382

(22) Filed: Nov. 19, 2021

(65) Prior Publication Data

US 2023/0165126 A1 May 25, 2023

(51) Int. Cl.
| | |
|---|---|
| H10K 85/10 | (2023.01) |
| C09K 11/77 | (2006.01) |
| H01L 33/50 | (2010.01) |
| H10K 50/11 | (2023.01) |
| H10K 71/00 | (2023.01) |
| H10K 101/10 | (2023.01) |
| H10K 102/00 | (2023.01) |

(52) U.S. Cl.
CPC .......... *H10K 85/10* (2023.02); *C09K 11/7721* (2013.01); *H01L 33/502* (2013.01); *H10K 50/11* (2023.02); *H10K 71/00* (2023.02); *H10K 2101/10* (2023.02); *H10K 2102/00* (2023.02)

(58) Field of Classification Search
CPC ........ H10K 85/10; H10K 50/11; H10K 71/00; H10K 2101/10; H10K 2102/00; C09K 11/7721; C09K 11/7774; C09K 11/02; H01L 33/502; H01L 2933/0041; H01L 33/501; C08G 77/16; C08G 77/18; C09D 183/04; C09D 7/61; H05B 33/20; C08K 3/013; C08K 3/36; C08K 3/22; C08L 83/00

See application file for complete search history.

(56) References Cited

U.S. PATENT DOCUMENTS

| | | |
|---|---|---|
| 8,546,159 B2 | 10/2013 | Yoo et al. |
| 8,736,036 B2 | 5/2014 | Chandra |

(Continued)

FOREIGN PATENT DOCUMENTS

| | | |
|---|---|---|
| EP | 2589642 A1 | 5/2013 |
| EP | 2922104 A1 | 9/2015 |

OTHER PUBLICATIONS

Jan Ziegler et al. "Silica-Coated InP/ZnS Nanocrystals as Converter Material in White LEDs", Advanced Materials, 2008, 20, pp. 4068-4073.

(Continued)

*Primary Examiner* — Jonathan Han
(74) *Attorney, Agent, or Firm* — ArentFox Schiff LLP

(57) ABSTRACT

A method for preparing a wavelength converting film is disclosed. The method comprising mixing at least one phosphor, a polysiloxane and optionally an organic solvent, thereby preparing a mixture, placing the mixture on a substrate, pre-curing the mixture on the substrate, thereby preparing a wavelength converting film. Furthermore, a wavelength converting film is disclosed, a method for preparing a light-emitting device and a light-emitting device.

15 Claims, 6 Drawing Sheets

(56) References Cited

U.S. PATENT DOCUMENTS

| | | | |
|---|---|---|---|
| 9,117,979 B2 | 8/2015 | Matsumura et al. | |
| 2007/0004065 A1 | 1/2007 | Schardt et al. | |
| 2013/0125365 A1 | 5/2013 | Goto et al. | |
| 2015/0188007 A1* | 7/2015 | Mochizuki | C08K 5/5435 |
| | | | 252/301.36 |
| 2015/0303358 A1* | 10/2015 | Ko | H01L 33/50 |
| | | | 438/27 |

OTHER PUBLICATIONS

Jan Ziegler "Preparation and Application of Nanocrystals for White LEDs", School of Chemical Sciences and Pharmacy, University of East Anglia, Norwich, U.K., pp. 1-210.

\* cited by examiner

CURABLE SELF-ADHESIVE WAVELENGTH CONVERTING FILM AND LIGHT EMITTING DEVICE COMPRISING THE SAME

TECHNICAL FIELD

The present disclosure relates to a method for preparing a wavelength converting film, a wavelength converting film, a method for preparing a light-emitting device and a light-emitting device.

BACKGROUND

One of the methods to produce light emitting diodes (LEDs) of white or other specific color is to use a combination of the blue LED die and a luminescent phosphor. The phosphor converts part of the blue radiation into the light of a different wavelength resulting in an LED of the desired spectral signature.

The phosphor is often provided as a wavelength converting element, such as a platelet, e.g., a ceramic platelet, a layer, or a crystal. To prepare a wavelength converting element, the phosphor powder may be dispersed in an organic binder and be applied on the top of the LED die as a wavelength converting layer.

High-power LED products demand high thermal conductivity of the wavelength converting element. Therefore, a common application method involves either producing a separate converting element with a very high concentration of the phosphor in the binder, followed by attaching of the element to the LED die, or dispensing the phosphor-binder mixture directly on the wafer by spray-coating or other techniques. U.S. Pat. No. 8,736,036 describes a method of assembly of the LEDs by producing the wavelength converting element as a large sheet followed by attaching the entire sheet to the full wafer and dicing the resulting assembly into individual LED packages. This method provides cost saving by eliminating the pick-and-place process for attaching individual converters with additional adhesive. Compared to spray coating, in this method the film manufacturing technology provides the film with precisely controlled thickness and uniform composition. A number of patents and patent applications describe the above-mentioned type of material as a phosphor-polymer mixture intended to be laminated onto a surface of plurality of LED dies.

U.S. Pat. No. 8,736,036 describes the polymeric binder as silicone, U.S. Pat. No. 8,546,159 describes it as a "B-Stage cured resin material", US 20070004065 describes a film made of a phosphor-filled polymer and a separate layer of a pressure-sensitive adhesive.

US 20130125365 describes the polymeric binder as a cured silicone, where the curing is enabled by hydrosilylation reaction between vinyl and hydrosilane groups of different molecules in the presence of a Platinum-based catalyst.

U.S. Pat. No. 9,117,979 describes a method of bonding of the silicone-based phosphor containing wavelength converting film by applying a layer of an adhesive material between the film and the LED die. In the same patent, the curing chemistries provided for the formation of the said film include hydrosilylation or condensation reaction occurring by moisture in the air or a catalyst. This type includes a dealcoholization type, a deoximation type, an acetic acid elimination type, and a hydroxyamine elimination type.

Herein is described a method for preparing a wavelength converting film, a wavelength converting film, a method for preparing a light-emitting device and a light-emitting device.

SUMMARY

It is an object to obviate the disadvantages of the prior art.

It is another object to provide a method for preparing a wavelength converting film.

It is a further object to provide a wavelength converting film prepared by a method according to the present invention.

It is a further object to provide a method for preparing a light-emitting device.

It is a further object to provide a light-emitting device prepared by a method according to the present invention.

In accordance with one object, there is provided a method for preparing a wavelength converting film, the method comprising mixing at least one phosphor, a polysiloxane and optionally an organic solvent, thereby preparing a mixture, placing the mixture on a substrate, pre-curing the mixture on the substrate, thereby preparing a wavelength converting film.

In accordance with another object, there is provided a wavelength converting film prepared by a method according to the present invention.

In accordance with another object, there is provided a method for preparing a light-emitting device, the method comprising the steps of providing a LED die, placing a wavelength converter film according to the present invention on the LED die, optionally removing the substrate, curing the wavelength converter film, thereby preparing a light-emitting device, wherein the wavelength converter film is placed with the side opposite to the substrate on the LED die.

In accordance with another object, there is provided a light-emitting device prepared by a method according to the present invention.

DETAILED DESCRIPTION

Figure 1:
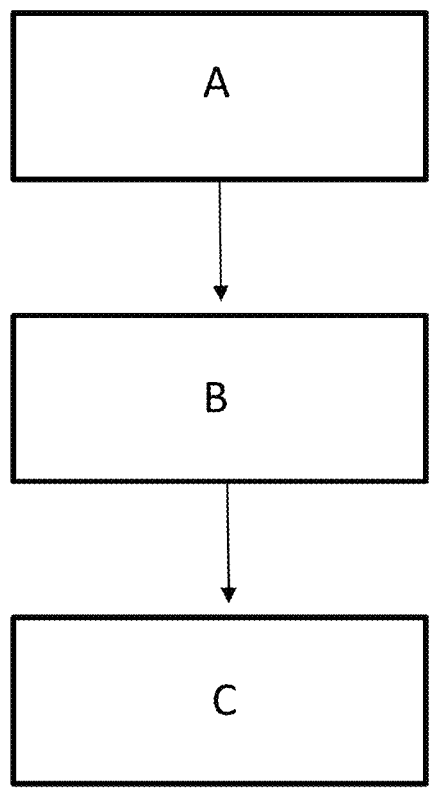
FIG. 1 shows a method for preparing a wavelength converting film.

For a better understanding, together with other and further objects, advantages and capabilities thereof, reference is made to the following disclosure and appended claims taken in conjunction with the above-described drawings.

References to the color of the phosphor and LED die refer generally to its emission color unless otherwise specified. Thus, a blue LED die emits a blue light, a yellow phosphor emits a yellow light and so on.

In accordance with an object of the present invention, there is provided a method for preparing a wavelength converting film, the method comprising mixing at least one phosphor, a polysiloxane and optionally an organic solvent, thereby preparing a mixture, placing the mixture on a substrate, pre-curing the mixture on the substrate, thereby preparing a wavelength converting film.

A wavelength converting film according to the present disclosure is a film that converts light of a certain first wavelength to light of a certain second wavelength.

According to the method of the present invention, at least one phosphor, a polysiloxane and optionally an organic solvent is mixed.

A phosphor is a material that converts light of a certain first wavelength to light of a certain second wavelength.

The phosphor may be selected from common phosphors. In an embodiment, the phosphor is selected from the group consisting of garnets, nitridosilicates, oxynitridosilicates, alumonitridosilicates, alumooxynitridosilicates, oxysilicates, perovskites, silicates and combinations thereof.

Exemplary phosphors may be selected from the following list of phosphors:

$(RE_{1-x}EU_x)_3(Al_{1-y}A'_y)_5O_{12}$ where RE is at least one of Y, Lu, Tb, and Gd, x is in a range $0<x\le0.1$, A' is at least one of Sc and Ga, and y is in a range $0\le y\le 1$);

$(RE_{1-x}Ce_x)_3(Al_{5-2y}Mg_ySi_y)O_{12}$ where RE is at least one of Y, Lu, Tb, and Gd, x is in a range $0<x\le0.1$, and y is in a range $0\le y\le 2$;

$(RE_{1-x}Ce_x)_3Al_{5-y}Si_yO_{12-y}N_y$ where RE is at least one of Y, Lu, Tb, and Gd, x is in a range $0<x\le0.1$, and y is in a range $0\le y\le 0.5$;

$(RE_{1-x}Ce_x)_2CaMg_2Si_3O_{12}:Ce^{3+}$ where RE is at least one of Y, Lu, Tb, and Gd, and x is in a range $0<y\le0.1$, $(AE_{1-x}EU_x)_2Si_5N_8$ where AE is at least one of Ca, Sr, and Ba, and x is in a range $0<x\le0.1$;

$(AE_{1-x}EU_x)AlSiN_3$ where AE is at least one of Ca, Sr, and Ba, an x is in a range $0<x\le0.1$;

$(Sr_{1-x}EU_x)LiAl_3N_4$ where x is in a range $0<x\le0.1$;

$(AE_{1-x}EU_x)_3Ga_3N_5$ where AE is at least one of Ca, Sr, and Ba, and x is in a range $0<x\le0.1$;

$(AE_{1-x}EU_x)Si_2O_2N_2$ where AE is at least one of Ca, Sr, and Ba, and x is in a range $0<x\le0.1$;

$(AE_xEU_y)Si_{12-2x-3y}Al_{2x+3y}O_yN_{16-y}$ where AE is at least one of Ca, Sr, and Ba, x is in a range $0.2\le x\le 2.2$, and y is in a range $0<y\le 0.1$;

$(AE_{1-x}EU_x)_2SiO_4$ where AE is at least one of Ca, Sr, and Ba, and x is in a range $0<x\le0.1$; and $(AE_{1-x}EU_x)_3SiO_5$ where AE is at least one of Ca, Sr, and Ba, and x is in a range $0<x\le0.1$.

The exemplary phosphors might also incorporate fluoride, chloride, bromide or iodide ions.

The at least one phosphor might be one type of phosphor, or might be a mixture of phosphors. The phosphor, or the mixture of phosphors might be selected to obtain a specific desired second wavelength, when used in a wavelength converter that converts light of a certain first wavelength to light of a certain second wavelength.

The phosphor might be present in an amount of between about 1 wt. % to about 80 wt. %, preferably from about 5 wt. % to about 65 wt. %, more preferably from about 25 to about 65 wt. %, based on the total weight of the mixture comprising the at least one phosphor, the polysiloxane and optionally the organic solvent.

The mixture comprises further a polysiloxane. A polysiloxane is a polymer with —Si(R)$_2$O— units, wherein R is an organic residue, preferably an alkyl, aryl, or cycloalkyl residue. The polysiloxane might be a polysiloxane of a specific formula, e.g., of formula (I) or might be a mixture of different polysiloxanes, e.g., different polysiloxanes of formula (I).

In an embodiment, the polysiloxane is a polysiloxane of formula (I):

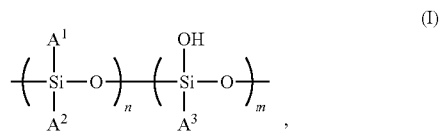

wherein
n:m=1:1 to 10:1;
$A^1$, $A^2$, $A^3$ are independently selected from the group consisting of $C_1$-$C_6$ alkyl, $C_6$-$C_{12}$ aryl, and $C_3$-$C_{12}$ cycloalkyl.

The ratio of indices "n" and "m" might be selected from 1:1 to 10:1, preferably from 3:1 to 8:1, more preferably from 4:1 to 6:1.

The residues $A^1$, $A^2$ and $A^3$ in formula (I) might be the same, or might be different. The residues $A^1$, $A^2$ and $A^3$ might independently be selected from $C_1$-$C_6$ alkyl, $C_6$-$C_{12}$ aryl, and $C_3$-$C_{12}$ cycloalkyl. Exemplary $C_1$-$C_6$ alkyls are methyl, ethyl, propyl, butyl, pentyl and hexyl, wherein methyl and ethyl are preferred. Exemplary $C_6$-$C_{12}$ aryl are phenyl, benzyl and naphthyl, wherein phenyl is preferred. Exemplary $C_3$-$C_{12}$ cycloalkyl are cyclopropyl, cyclobutyl, cyclopentyl and cyclohexyl, wherein cyclohexyl is preferred.

In an embodiment, $A^1$, $A^2$, $A^3$ are methyl. In a further embodiment, $A^1$, $A^2$, $A^3$ are phenyl. In a further embodiment, $A^1$ and $A^2$ are methyl and $A^3$ is phenyl.

The total fraction of phenyl groups among the side groups $A^1$, $A^2$ and $A^3$ in the formula (I) is from about 10% to 100%, preferably from about 25% to 80%, more preferably from 25% to 50% with respect to the total number of the side groups of $A^1$, $A^2$ and $A^3$ in the formula (I).

The polysiloxane might be present in an amount of between about 1 wt. % to about 80 wt. %, preferably from about 5 wt. % to about 65 wt. %, more preferably from about 25 to about 65 wt. %, based on the total weight of the mixture comprising the at least one phosphor, the polysiloxane and optionally the organic solvent.

The mixture might further comprise an organic solvent. The organic solvent may be added to the mixture to modify viscosity. The organic solvent is selected to dissolve the polysiloxane, without destroying the polysiloxane. Exemplary organic solvents are aliphatic hydrocarbons (e.g., hexane, heptane, octane), aromatic hydrocarbons (e.g., toluene, xylene), chlorinated hydrocarbons (e.g., methylene chloride, chloroform, chlorobenzene, chlorocyclohexane), esters (e.g., ethyl acetate, butyl acetate, propyl propionate, butoxyethyl acetate, propylene glycol methyl ether acetate), ketones (e.g., acetone, methylethyl ketone, methyl ethyl ketone, methyl isobutyl ketone), and ethers (e.g., dibutyl ether, tetrahydrofurane, diphenyl ether, anisole). Preferred organic solvents are toluene, xylene, acetone, heptane, and butyl acetate, more preferred are toluene and butyl acetate.

The solvent may be added in an amount of between about 1 wt. % to about 30 wt. %, preferably in an amount of between about 1 wt. % to about 10 wt. %, with respect to the total amount of the mixture.

The mixture may be homogenized with a mixing equipment. The mixing is preferably carried out with a high speed stirrer, high shear mixer, planetary centrifugal mixer, 3-roll mill, ball mill grinder, or a combination thereof.

The mixture is placed on a substrate. The substrate is intended to hold the wavelength converting film before application e.g., to the surface of a LED die. The wavelength converting film might remain on the substrate until it is transferred, e.g. to a LED die. Alternatively, the wavelength converting film is released from the substrate when it is sufficiently dried to handle.

In an embodiment, the substrate is selected from a plastic film, or a glass.

A plastic film is a layer of an organic polymer with a thickness of between about 0.01 mm to about 5 mm, preferably of between about 0.01 mm to about 1 mm, more preferably of between about 0.05 mm to about 0.2 mm. The organic polymer might be polypropylene, polyethylene, polyvinylchloride, polyester (e.g., polyethylene terephthalate), or fluoropoplymer (e.g., polyfluoroalkoxy alkane, polyvinylidene fluoride). The plastic film might optionally be coated, e.g., the plastic film might be coated with an organosilane, silicone, or a fluorocarbon type coating layer.

The substrate might also be glass, such as borosilicate glass. The glass might have a thickness of between about 0.01 mm to about 5 mm, preferably of between about 0.01 mm to about 1 mm, more preferably of between about 0.01 mm to about 0.2 mm.

The mixture might be placed on the substrate with extrusion, tape casting, spray coating, doctor blade coating, roller coating, and screen printing.

The mixture may be solidified over time either due to evaporation of the solvent, or by condensation of a portion of the silanol groups, or by the combination of both. This might be interpreted as pre-curing.

The solidifying mechanism provided by cross-linking of the individual polymer chains of the polysiloxane via condensation of silanol groups might eliminate the need of common catalysts, e.g., platinum catalyst as in hydrosilylation and the need for moisture as in other condensation chemistries typically employed in curing of silicones. Platinum catalysts are often linked to yellowing of silicones at higher temperatures, which is undesirable in optical grade materials. Moreover, the $CH_2$—$CH_2$ cross-linking sites produced by hydrosilylation are the weak points in the thermal decomposition of cured silicones. A further condensation method is the moisture-induced condensation, wherein during curing the access of moisture to the material is important. However, the diffusion of moisture to the LED die wavelength converting film interface is in the preset case hindered by the thickness of the film, thus making this type of cure ineffective for ensuring good adhesion between the said film and the LED die. The silanol condensation cure, by not requiring moisture or Pt catalyst as well as by creating a thermally stable Si-O-Si bond, is free of the above-mentioned deficiencies.

According to the method of the present invention, the mixture on the substrate is pre-cured. Pre-cured according to the present invention might be understand, that the mixture is converted from a liquid state into a thermoplastic state. Pre-curing is preferably carried out at temperatures of between about 30° C. to about 150° C., preferably from about 50° C. to about 130° C., more preferably from about 70° C. to about 120° C. Pre-curing is carried out for about 3 hours to about 72 hours, preferably for about 5 hours to about 20 hours, more preferably for about 10 hours to about 15 hours.

In an embodiment, the pre-curing is carried out at 50° C. to about 130° C. for about 5 hours to about 20 hours. In an alternative embodiment, the pre-curing is carried out at 70° C. to about 120° C. for about 10 hours to about 15 hours.

The pre-curing might be carried out under an inert atmosphere, e.g., under a nitrogen atmosphere, or an argon atmosphere. Alternatively, the pre-curing might be carried out under vacuum.

In an embodiment of the present invention, the method further comprises the step of removing the substrate. The substrate is preferably removed when the substrate is plastic film. The substrate might be removed mechanically by peeling.

In an embodiment of the present invention, the method further comprises the step of adding a catalyst and/or a filler material. A catalyst might be added to accelerate the pre-curing and thus the reaction of the condensation of the silanol groups of the polysiloxane to obtain a thermoplastic state. As a catalyst any catalyst that accelerates the reaction of silanol groups. Typical catalysts may be inorganic metal catalysts, or organic catalysts. The inorganic metal catalyst may be selected from tin compounds, aluminum compounds, and titanium compounds. Exemplary catalysts may be titanium alkoxides (such as titanium butoxide, titanium isopropoxide), aluminum alkoxides (such as aluminum s-butoxide bis(ethylacetoacetate)), and organic salts of tin (such as bis(2-ethylhexanoate)tin, dibutyltin dilaurate). The catalyst may also be an organic catalyst. Organic catalysts may be organic bases (such as amines, pyridines, guanidines), or combination thereof. The catalyst may also be a combination of said inorganic metal catalysts and said organic catalysts. The catalyst may be added in an amount of between about 0.1 wt. % to about 3 wt. %, preferably from about 0.2 wt. % to about 1 wt. %, more preferably from about 0.5 wt. % to about 1 wt. %, with respect to the amount of the polysiloxane.

A filler material might also be added in the method of the present invention. The filler material might be added in addition to the catalyst, or alternatively to the catalyst. A filler material might be a material that modifies light scattering, modifies rheological properties, increases the refractive index or thermal conductivity, etc. The filler may be selected from inorganic compounds, such as oxides, or dioxides. Typical fillers are titanium dioxide, silicon dioxide, zirconium dioxide, aluminum oxide, cerium oxide, zinc oxide, etc., or combinations thereof. The filler may be added in an amount of between about 1 wt. % to about 65 wt. %, preferably from about 5 wt. % to about 65 wt. %, more preferably from about 25 wt. % to about 65 wt. %, with respect to the mixture.

The present invention is further directed to a wavelength converting film prepared by a method according to the present invention.

The present invention is also directed to a method for preparing a light-emitting device, the method comprising the steps of providing a LED die, placing a wavelength converter film according to the present invention on the LED die, optionally removing the substrate, curing the wavelength converter film, thereby preparing a light-emitting device, wherein the wavelength converter film is placed with the side opposite the substrate on the LED die.

A LED die is an object that emits light of a certain first wavelength, e.g., blue light.

According to the method for preparing a light-emitting device of the present invention a wavelength converter film according to the present invention is placed on the LED die. As disclosed herein the wavelength converter film is prepared by a method comprising mixing at least one phosphor, a polysiloxane and optionally an organic solvent, thereby preparing a mixture, placing the mixture on a substrate, pre-curing the mixture on the substrate, thereby preparing a wavelength converting film.

The at least one phosphor, the polysiloxane, the organic solvent, the substrate and the pre-curing correspond to the respective features as described herein.

The wavelength converting film by itself has pressure sensitive adhesive properties, thus eliminating the need for an additional adhesive layer between the wavelength converting film and the LED die. In some embodiments, the wavelength converting film shows adhesive properties at room temperature. In alternative embodiments, the wavelength converting film shows adhesive properties at temperatures higher than room temperature, preferably at temperatures higher than 30° C.

According to the method for preparing a light-emitting device of the present invention, the substrate is optionally removed. Removing the substrate is preferably carried out when the substrate is glass.

In a further step of the method for preparing a light-emitting device of the present invention, is curing the wavelength converter film. In an embodiment of the present invention, the curing is carried out at a temperature of between about 100° C. to about 200° C. The curing may be carried out at a temperature of between about 120° C. to about 180° C., preferably at a temperature of between about 140° C. to about 160° C. The curing might be for about 2 hours to about 20 hours, preferably for about 8 hours to about 16 hours, more preferably for about 10 hours to about 12 hours.

In an embodiment, the curing is at a temperature of between about 100° C. to about 200° C. for about 5 hours to about 20 hours. In an alternative embodiment, the curing is at a temperature of between about 120° C. to about 180° C. for about 8 hours to about 12 hours.

The curing might be carried out under an inert atmosphere, e.g., under a nitrogen atmosphere, or an argon atmosphere.

In an embodiment of the present invention, the method for preparing a light-emitting device of the present invention further comprises the step of dicing the light-emitting device. Suitable dicing methods are those applied for semiconductor dicing. The dicing might be carried out by saw dicing, or laser dicing. The dicing might also be understood as a singulation of individual light emitting devices.

In one embodiment of the invention the wavelength converting film comprising the substrate is positioned over the array of LED dies mounted on a solid support plate, or over the wafer of LED dies, followed by pressing the wavelength converting film to the surface of the dies thus providing the direct contact between the surface of the said dies and the said wavelength converting film. The pressing may be performed by passing the assembly through a pair of rolls or by lowering a flat plate on the top of the assembly, or by vacuum lamination, or by any other suitable method. The support sheet may then be released followed by curing the wavelength converting film on the top of the LED dies by explosion to elevated temperature. The cured assembly is separated into individual LED elements each containing the layer of the wavelength converting film on the top of the individual LED die.

In another embodiment of the invention the wavelength converting film is removed from the substrate and positioned on the top of the array of LED dies or on the entire wafer of LED dies. The resulting assembly may be exposed to an elevated temperature to cure the wavelength converting film. The cured assembly may be separated into individual elements each containing the layer of the wavelength converting film on the top of the individual LED die.

The present invention is further directed to a light-emitting device prepared by a method of the present invention.

A light-emitting device of the present invention might be used in general lighting, stage lighting, infrared lighting, automotive lighting, sensing, displays, etc.

FIG. 1 shows a method of preparing a wavelength converting film. In a first step A at least one phosphor, a polysiloxane and optionally an organic solvent are mixed, thereby preparing a mixture. In a further step B, the mixture is applied on a substrate. In a further step C, the mixture on the substrate is pre-cured, thereby preparing a wavelength converter film.

Figure 2:
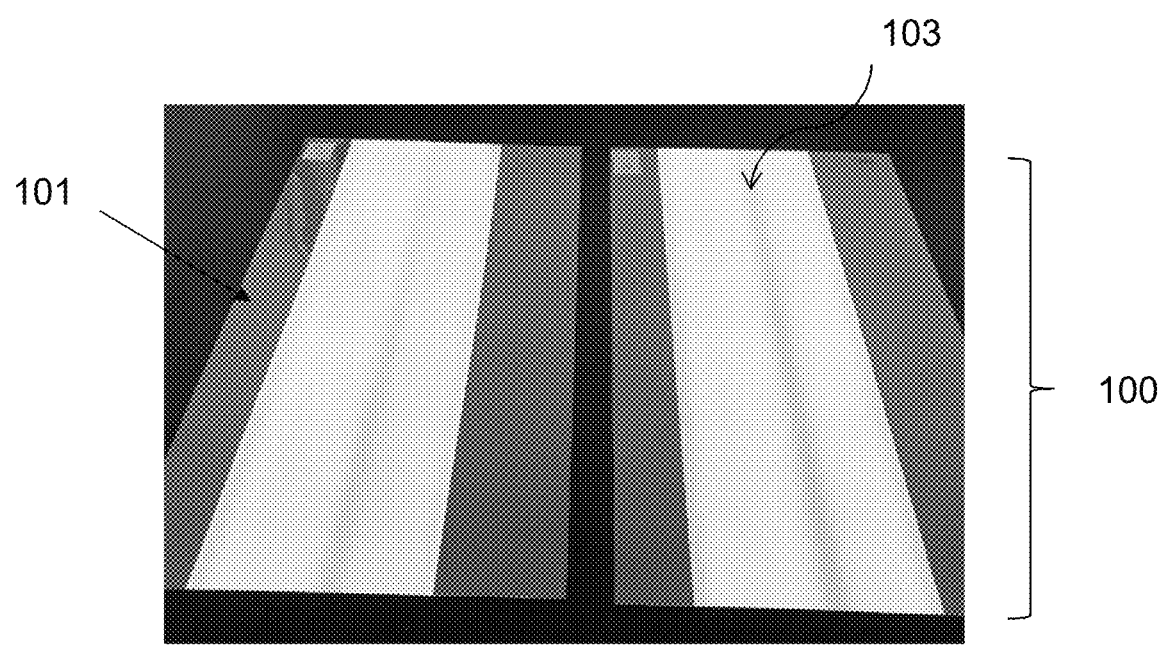
FIG. 2 shows a wavelength converting film according to the present invention.

FIG. 2 shows a wavelength converting film 100. The mixture 103 is on a substrate 101. The mixture 103 was prepared by mixing 4.150 g of polysiloxane+3% silica (24.47 wt. %), 12.460 g phosphor (73.47 wt. %) and 0.350 g propyl propionate (2.06 wt. %).

Figure 3:
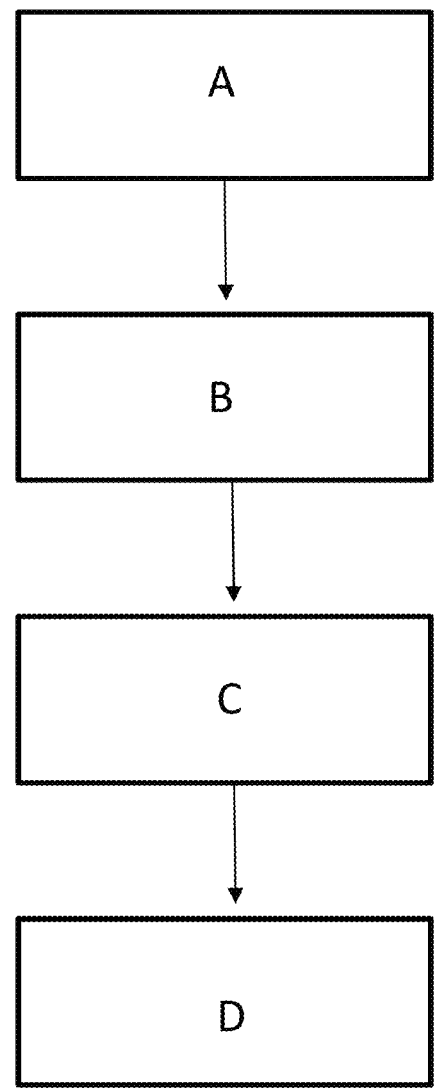
FIG. 3 shows a method for preparing a light-emitting device.

FIG. 3 shows a method for preparing a light-emitting device. In a first step A, a LED die is provided. In a subsequent step B, a wavelength converter film according to the present invention is placed on a LED die. In a further step C, the substrate is optionally removed. In a further step D, the wavelength converter film is cured.

Figure 4:
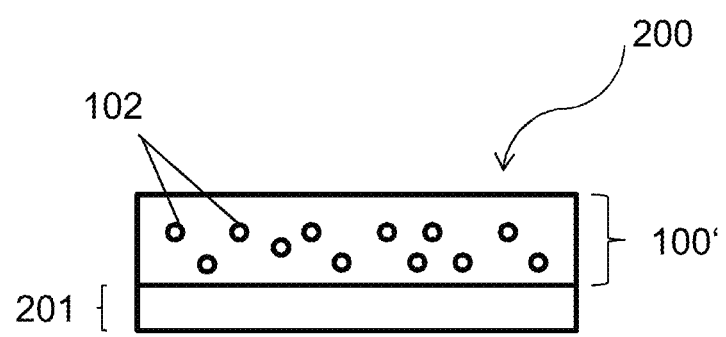
FIG. 4 shows a light-emitting device comprising a LED die, a wavelength converting film without a substrate comprising filler material.

FIG. 4 shows a light-emitting device 200 comprising a LED die 201, a wavelength converting film without a substrate 100' comprising filler material 102. The LED die 201 might emit blue light and the wavelength converting film without substrate 100' is placed in direct contact with the LED die 201. The wavelength converting film without substrate 100' comprises filler material 102. The filler material might be titanium dioxide, silicon dioxide, zirconium dioxide, aluminum oxide, cerium oxide, zinc oxide, etc., or combinations thereof., that enhances the light scattering of the blue light emitted from the LED die 201.

Figure 5:
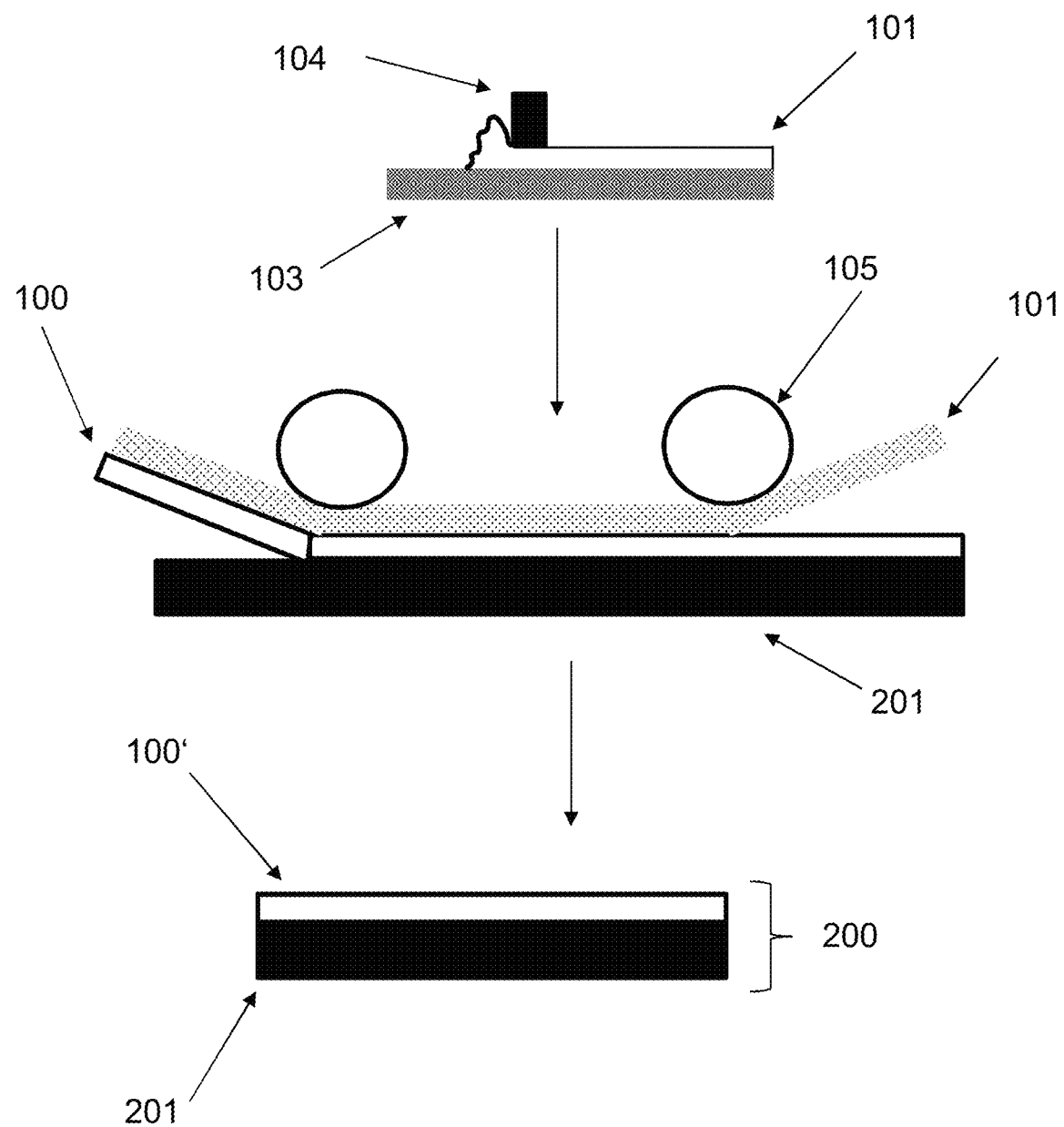
FIG. 5 shows a method for preparing a light-emitting device.

FIG. 5 shows a method for preparing a light-emitting device 200. In a first step, a mixture 103 comprising at least one phosphor, a polysiloxane and optionally an organic solvent is applied with doctor blade 104 on a substrate 101. The substrate 101 might be a polyester film. After keeping the mixture 103 on the substrate 101 at room temperature, the temperature is elevated for 12 to 24 hours at 60 to 100° C. for pre-curing the mixture 103 on the substrate 101. After the pre-curing, the mixture is in a thermoplastic state and thus, the wavelength converting film 100 is prepared. Subsequently, the wavelength converting film 100 is placed on the LED die 201 with a roller 105. At the same time the, substrate 101 (e.g., the polyester film) is peeled off. In a final step, curing at a temperature of 150° C. for 4 hours leads to a light-emitting device 200 comprising a wavelength converting film without a substrate 100' and a LED die 201.

In a subsequent annealing step at 200° C. for 4 hours and at 250° C. for 4 hours it was shown that there are neither cracks, nor delamination.

Figure 6:
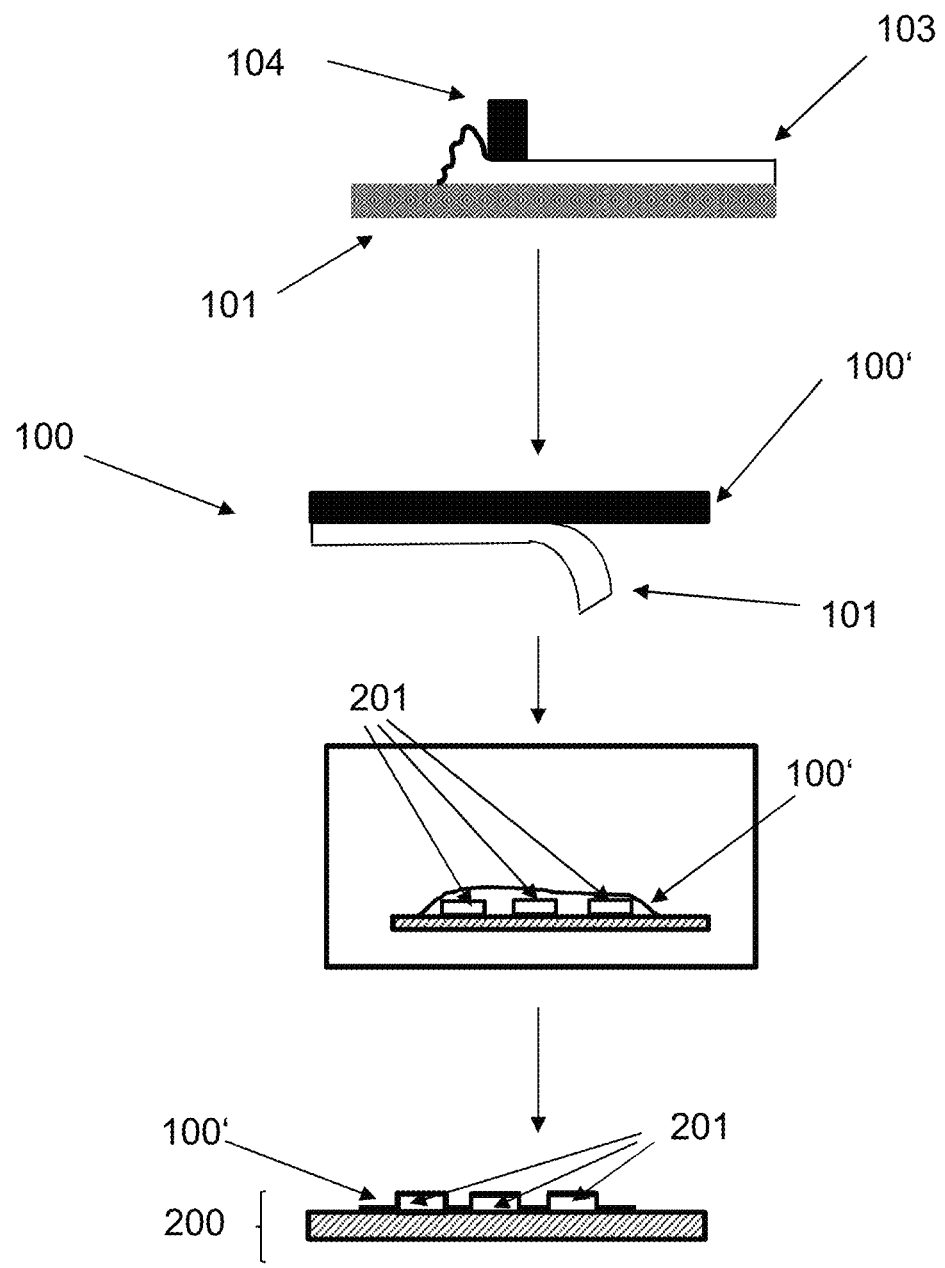
FIG. 6 shows a further method for preparing a light-emitting device.

FIG. 6 shows a further method for preparing a light-emitting device 200. In a first step, a mixture 103 comprising at least one phosphor, a polysiloxane, optionally an organic solvent and optionally a filler material (e.g., Aerosil) is placed with a doctor blade 104 on a substrate 101. The substrate 101 might be a polyester film. After keeping the mixture 103 on the substrate 101 at room temperature, the temperature is elevated for 12 to 24 hours at 50° C. for pre-curing the mixture 103 on the substrate 101. After the pre-curing, the mixture is in a thermoplastic state and thus, the wavelength converting film 100 is prepared. The substrate 101 peels off the wavelength converting film 100 to obtain a wavelength converting film without substrate 100'. The wavelength converting film without substrate 100' is optionally cut into pieces. Subsequently, the wavelength converting film without substrate 100' is placed on several LED dies 201 in a vacuum oven and vacuum is pulled. The temperature is elevated to 50 to 70° C.

The vacuum oven is opened to air and a curing step is carried out at a temperature of 150 for 4 hours to obtain a light-emitting device 200 with several LED dies 201 and a wavelength converting film without substrate 100'.

EXAMPLES

Example 1

Material Preparation.

The mixture with the following composition was prepared:

22.8 wt % of Polymer A with the following general formula:

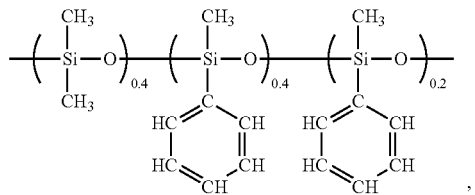

9.5 wt % of Polymer B of the following general formula:

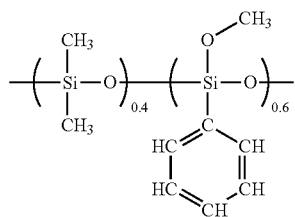

1.3 wt % of hydrophobically-treated fumed silica,
5.7 wt % of xylene,
60.7 wt % of YAG:Ce ($Y_3Al_5O_{12}$:Ce) phosphor powder.

Polymer A, Polymer B, xylene, and hydrophobically-treated fumed silica were mixed together and homogenized using a 3-roll mill. YAG phosphor was added and distributed using a planetary mixer.

Preparation of the Self-Adhesive Layer.

A catalyst, titanium butoxide in the amount of 0.3 wt % of the mixture, was added and mixed in with a planetary mixer. The mixture with catalyst was poured into the tape casting box having a gap with the width of 100 cm and the height of 0.1 mm. The material was dispensed on a non-sticky plastic film in a form of a coating by moving the tape casting box along the film. The material was allowed to dry at room temperature for 72 hours followed by pre-curing in the oven at 60° C. for another 72 hours. The resulting coating was a sticky solid, Application of the Material.

The plastic film with the coating was cut into 100×100 mm segments. Each segment was placed on a glass sheet as imitation of a LED die with the coating side contacting the glass. Here, glass sheet was used as an imitation of the LED die. The coating was allowed to adhere to the glass by rolling with the rubber-coated roller, the plastic film was removed, leaving the phosphor-filled polysiloxane layer directly on glass. The resulting coated glass was cured in the oven at 150° C. for 24 hours, resulting in a solid, non-sticky rubbery coating on the surface of the glass.

Example 2

Material Preparation.

The mixture of the wavelength converting film was prepared identically to the Example 1.

Preparation of the Hot-Melt Wavelength Converting Film

A catalyst, titanium butoxide, in the amount of 0.4 wt. % of the mixture was added and mixed in in a planetary mixer. The mixture with catalyst was poured into the tape casting box having a gap with the width of 100 cm and the height of 0.1 mm. The material was dispensed on a non-sticky plastic film in a form of a coating by moving the tape casting box along the film. The material was allowed to dry at room temperature for 16 hours followed by pre-curing in the oven at 120° C. for 20 hours. The resulting wavelength converting film was solid that was becoming soft and sticky upon heating above 50° C.

Application of the Material.

The wavelength converting film was removed from the plastic sheet and placed on a glass sheet Here, glass sheet was used as an imitation of the LED wafer. The assembly was placed in the vacuum lamination device, comprising of a hot plate inside the vacuum chamber. The vacuum was applied, the hot plate was heated to 60° C. in 30 s, the vacuum chamber was purged with air, and the hot plate was turned off. At the end of the process the wavelength converting film was adhered to the glass sheet. The resulting assembly was cured in the oven at 150° C. for 4 hours to produce non-sticky rubbery coating on glass.

While there have been shown and described what are at present considered to be preferred embodiments of the invention, it will be apparent to those skilled in the art that various changes and modifications can be made herein without departing from the scope of the invention as defined by the appended claims. The disclosure rather comprises any new feature as well as any combination of features, which in particular includes any combination of features in the appended claims, even if the feature or combination is not per se explicitly indicated in the claims or the examples.

REFERENCE SIGNS

100 wavelength converting film
100' wavelength converting film without a substrate
101 substrate
102 filler material
103 mixture
104 casting blade
105 roller
200 light-emitting device
201 LED die

What is claimed is:

1. A method for preparing a wavelength converting film, the method comprising:
    mixing at least one phosphor, a polysiloxane and optionally an organic solvent, thereby preparing a mixture,
    placing the mixture on a substrate,
    pre-curing the mixture on the substrate at a temperature between 30° C. and 150° C. for a duration of between 3 hours and 72 hours to form a thermoplastic film, removing the substrate from the thermoplastic film after pre-curing the mixture, and curing the thermoplastic film without the substrate at a temperature between 100° C. and 200° C. for a duration of between 2 hours and 20 hours, thereby preparing the wavelength converting film.

2. The method according to claim 1, wherein the polysiloxane is a polysiloxane of formula (I):

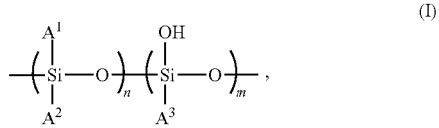

(I)

wherein n:m=1:1 to 10:1;

$A^1$, $A^2$, $A^3$ are independently selected from the group consisting of $C_1$-$C_6$ alkyl, $C_6$-$C_{12}$ aryl, and $C_3$-$C_{12}$ cycloalkyl.

3. The method according to claim 2, wherein the polysiloxane is a mixture of different polysiloxanes of formula (I).

4. The method according to claim 1, wherein the substrate is a plastic film, or a glass.

5. The method according to claim 1, wherein the substrate is a plastic film.

6. The method according to claim 1, wherein the substrate is glass.

7. The method according to claim 1, wherein the phosphor is selected from the group consisting of garnets, nitridosilicates, oxynitridosilicates, alumonitridosilicates, alumooxynitridosilicates, oxysilicates, perovskites, silicates and combinations thereof.

8. The method according to claim 1, further comprising the step of adding a catalyst and/or a filler material.

9. The method according to claim 1, wherein the polysiloxane is added in an amount of between about 1 wt. % to about 80 wt. %, with respect to the total amount of the mixture.

10. The method according to claim 1, wherein the phosphor is added in an amount of between about 1 wt. % to about 80 wt. %, with respect to the total amount of the mixture.

11. A wavelength converting film prepared by the method according to claim 1.

12. A method for preparing a light-emitting device, the method comprising the steps of:

providing a LED die, placing a wavelength converting film on the LED die, wherein the wavelength converting film is prepared by:

mixing at least one phosphor, a polysiloxane and optionally an organic solvent, thereby preparing a mixture, placing the mixture on a substrate, and pre-curing the mixture on the substrate at a temperature between 30° C. and 150° C. for a duration of between 3 hours and 72 hours to form the wavelength converting film, removing the substrate from the wavelength converting film after pre-curing the mixture, and curing the wavelength converting film without the substrate at a temperature between 100° C. and 200° C. for a duration of between 2 hours and 20 hours, thereby preparing a light-emitting device, wherein the wavelength converting film is placed with a side opposite to the substrate on the LED die.

13. The method according to claim 12, wherein the curing is carried out at a temperature of between about 100° C. to about 200° C.

14. The method according to claim 12, further comprising the step of dicing the light-emitting device.

15. A light-emitting device prepared by a method according to claim 12.

* * * * *